United States Patent [19]
Biche et al.

[11] Patent Number: 5,443,348
[45] Date of Patent: Aug. 22, 1995

[54] CASSETTE INPUT/OUTPUT UNIT FOR SEMICONDUCTOR PROCESSING SYSTEM

[75] Inventors: Michael R. Biche, Union City; Alexander Lurye, Fremont, both of Calif.

[73] Assignee: Semiconductor Systems, Inc., Fremont, Calif.

[21] Appl. No.: 92,842

[22] Filed: Jul. 16, 1993

[51] Int. Cl.$^6$ .............................. B65G 21/02; A47B 88/00
[52] U.S. Cl. ................................... 414/416; 312/327; 29/743; 414/940
[58] Field of Search ............... 414/416, 217, 224, 225, 414/226, 292, 331, 417, 419–422, 463, 609, 612, 586, 621–622, 723, 729–730, 273, 279, 280, 283, 935–941; 312/327, 321.5, 312, 313; 108/33; 29/743, 744; 118/50, 50.1, 500, 503, 729–730

[56] References Cited

U.S. PATENT DOCUMENTS

| | | | |
|---|---|---|---|
| 762,888 | 6/1904 | Decker | 322/327 |
| 2,165,122 | 7/1939 | Ashbery | 312/327 |
| 3,788,719 | 1/1974 | Whited | 312/327 |
| 3,854,605 | 12/1974 | Proper | 414/283 |
| 4,744,715 | 5/1988 | Kawabata | 414/416 |
| 5,048,164 | 9/1991 | Harima | 414/940 |

FOREIGN PATENT DOCUMENTS

922144  5/1947  France ......................... 312/327

*Primary Examiner*—Robert J. Oberleitner
*Assistant Examiner*—R. B. Johnson
*Attorney, Agent, or Firm*—Skjerven, Morrill, MacPherson, Franklin & Friel; David E. Steuber

[57] ABSTRACT

A cassette input/output unit handles cassettes which contain semiconductor wafers or other substrates that are to be delivered to or withdrawn from a semiconductor processing system. The input/output unit includes a drawer front which rotates 90° about a horizontal axis as it is opened. Thus a cassette containing wafers can easily be placed on the drawer front with the wafers oriented vertically, as they are normally carried, and the cassette will be rotated 90° as the drawer is closed, thereby orienting the wafers horizontally for access by a robot inside the photolithography system. The cassette may also be rotated about a vertical axis within the unit, so that several input/output units may be used with a robot which rotates about a fixed axis. A clamping mechanism grips the cassette firmly when it is placed in the unit.

9 Claims, 12 Drawing Sheets

CASSETTE INPUT/OUTPUT UNIT FOR SEMICONDUCTOR PROCESSING SYSTEM

FIELD OF THE INVENTION

This invention relates to semiconductor processing systems and, in particular, a unit for introducing to a photolithography system a cassette containing semiconductor wafers or other substrates.

BACKGROUND OF THE INVENTION

Silicon wafers which are being processed in a semiconductor fabrication facility are typically held in cassettes when they are not undergoing processing. A standard cassette has been adopted according to specifications issued by the Semiconductor Equipment Manufacturers Institute (SEMI), and the standard cassette is used almost universally in the semiconductor industry. The cassettes containing silicon wafers must be transported from one production step to the next throughout a fabrication facility. Typically, these cassettes are carried inside plastic boxes. Once a box with a cassette arrives at a particular piece of process equipment, an operator opens the box, removes the cassette and places the cassette into the equipment.

The cassettes are positioned inside the plastic transport boxes with the "H" bar forward and the flat surfaces of the wafers oriented vertically. The force of gravity keeps the wafers seated in the cassette.

Most processing equipment requires that the cassettes be introduced into the equipment with the "H" bar down and the wafers oriented horizontally. This configuration allows the equipment to access the individual wafers for processing. Thus, when the cassette is placed into the equipment, it must be rotated after it has been removed from the transport box. This rotation is typically done by an operator grasping the cassette from the side with both hands and rotating his or her wrists 90° while placing the cassette into the equipment. The repeated rotation of the filled cassettes, which typically weigh over seven pounds, has resulted in numerous repetitive use injuries, such as carpal tunnel syndrome, among equipment operators.

The processing equipment is increasingly being automated with robots. To keep the equipment safe for operators, it must be enclosed at all times. This requirement adds to the difficulty of cassette input and output. When an operator is inserting a cassette into or removing a cassette from the equipment, for example, a barrier must separate the operator and any potentially hazardous mechanisms in the equipment. The only alternative is to shut the equipment down at these times, but doing this detracts from the production rate of the equipment. To maximize the output of processed wafers, it is important that the equipment operate continuously. This means that the equipment should not be stopped in order to change cassettes.

Thus, there is a need for a cassette input/output unit which overcomes all of these problems, i.e., avoids the need for the operator to rotate the cassette when it is inserted into the equipment, provides a safety barrier at all times which prevents the operator from inadvertently making contact with robots or other hazardous mechanisms inside the equipment, and allows the equipment to be operated without interruption while cassettes are being exchanged.

SUMMARY OF THE INVENTION

The cassette input/output unit of this invention includes a cassette drawer and a mechanism which rotates the drawer approximately 90° about a horizontal axis when the drawer is opened by an operator. When the drawer is fully opened, the front of the drawer is essentially horizontal, and a wafer cassette may be placed on the drawer front with the wafers oriented vertically inside the cassette. At the same time, the bottom of the drawer is raised to a vertical orientation which prevents the operator from extending his or her arms into the interior of the equipment.

When the drawer is closed, it rotates into its normal position, with the drawer front oriented vertically and the drawer bottom oriented horizontally. As a result, the wafers inside the cassette are then oriented horizontally and are in position to be withdrawn from the cassette by a robot arm or other mechanism.

When the cassette has been placed into the unit and the drawer has been closed, it may be desirable to pivot the cassette about a vertical axis so that it is properly oriented with respect to a robot arm. Therefore, in a preferred embodiment, a rotation plate is provided which permits the cassette to pivot about a vertical axis thereby aligning it properly with respect to a robot arm. Also in the preferred embodiment, a clamp mechanism holds the cassette in place as soon as it is placed into the input/output unit by the operator.

Since the input/output unit of this invention prevents the operator from gaining access to the interior of the equipment, the equipment can be operated continuously. This makes it particularly advantageous to provide a plurality of input/output units, arranged vertically, horizontally, or in both directions, so that cassettes may be inserted into or withdrawn from the equipment without restricting an internal robot arm from exchanging wafers with other cassette input/output units.

DESCRIPTION OF THE INVENTION

Figure 1:
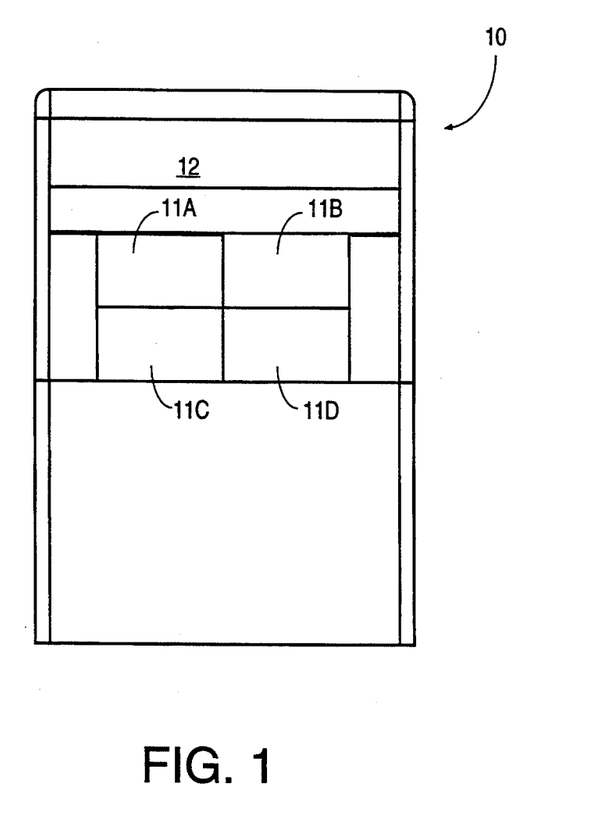
FIG. 1 illustrates an elevational view of a group of cassette input/output units according to this invention mounted in a photolithography system.

FIG. 1 illustrates a front elevation view of a photolithographic unit 10, which contains cassette input/output units 11A, 11B, 11C and 11D according to this invention. As indicated, cassette input/output units are arranged in two columns enclosed in a cabinet having a vertical wall 12. Photolithographic unit 10 could contain a spin coating machine, a developing machine, a heating/cooling unit, or other components used in semiconductor wafer processing facilities. Unit 10 in a preferred embodiment is controlled by a microprocessor in the manner described below.

Figure 2A:
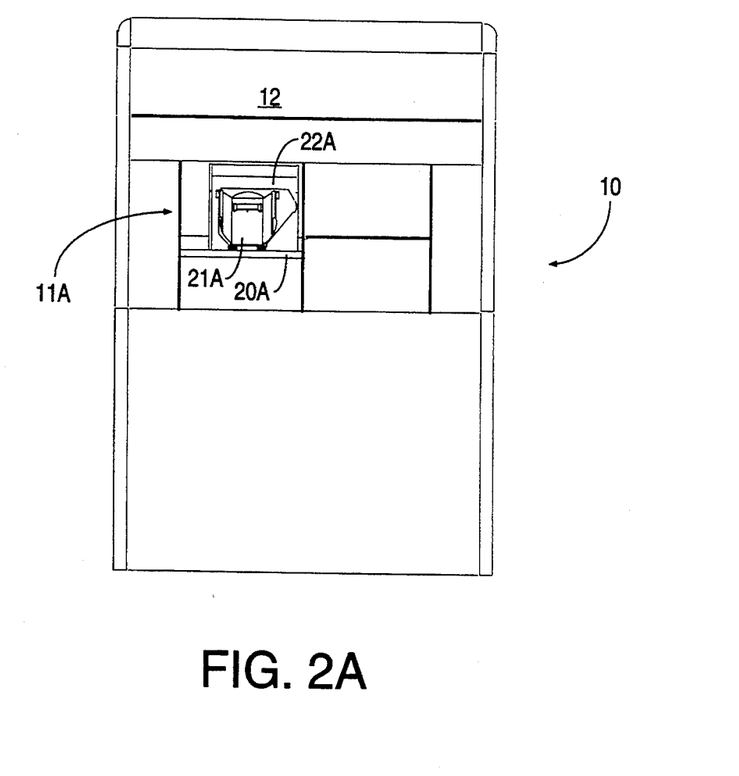
FIG. 2A illustrates a front elevational view similar to FIG. 1 with one of the cassette input/output units in an open position.
Figure 2B:
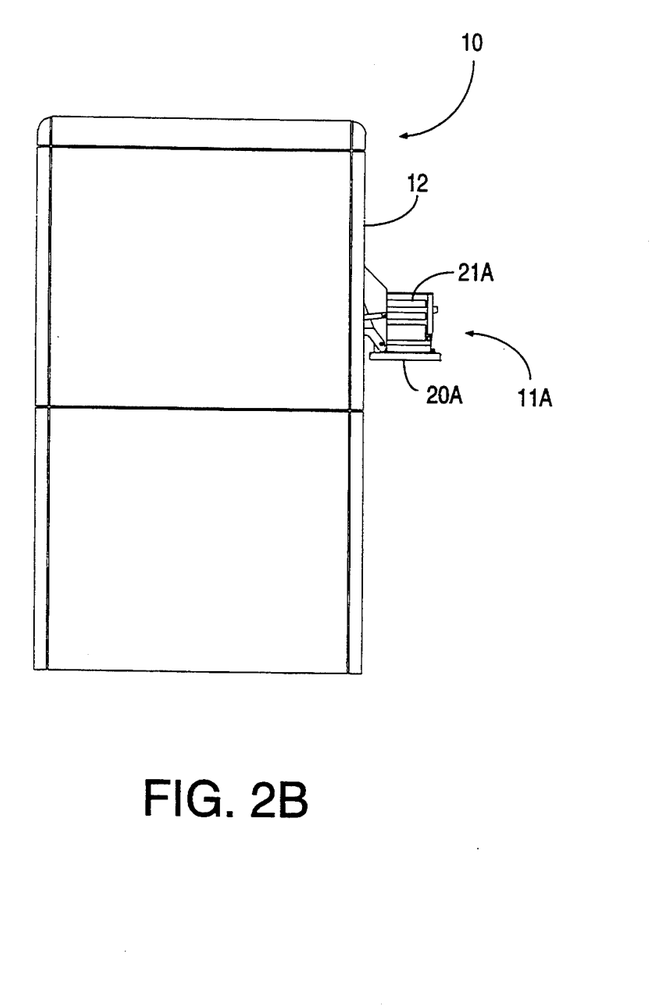
FIG. 2B illustrates a side elevational view of the photolithography system with one of the cassette input/output units in an open position.

FIG. 12A illustrates a similar view of unit 10 with cassette input/output unit 11A opened. FIG. 2B is a side elevation view of the same structure. Visible in either or both of FIGS. 2A and 2B are a drawer front 20A, a wafer cassette 21A and a drawer bottom 22A.

Figure 3:
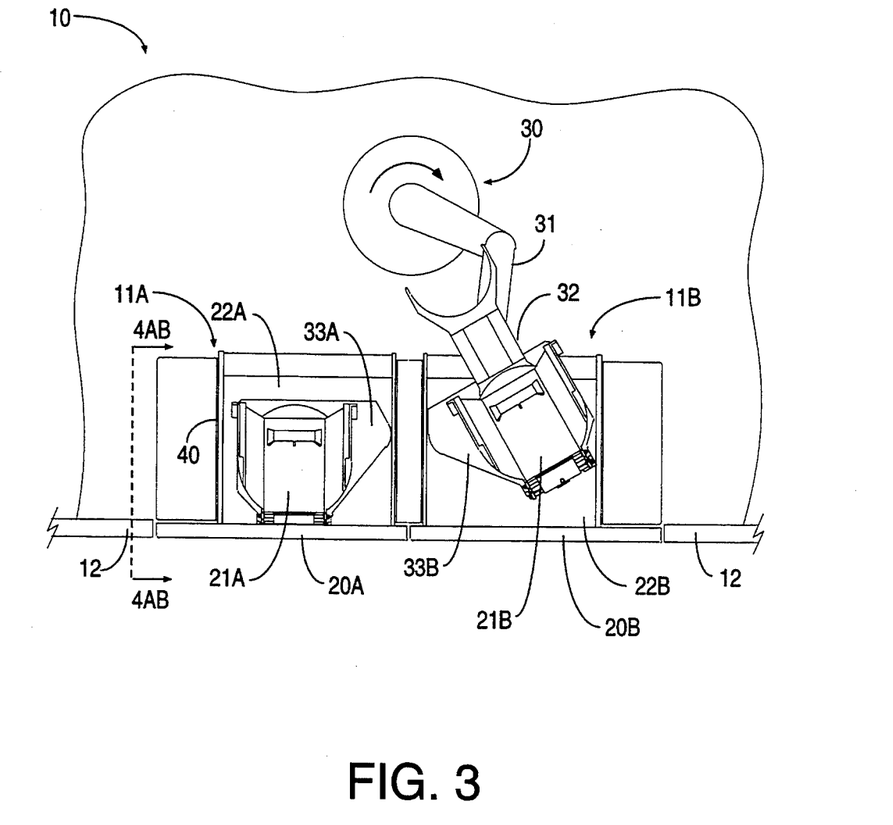
FIG. 3 illustrates a top plan view of two of the cassette input/output units in closed position.

FIG. 3 illustrates a top view of cassette input/output units 11A and 11B in the closed position. As is apparent, units 11A and 11B are essentially mirror images of each other. In FIG. 3, the wafers in wafer cassettes 21A and 21B are oriented horizontally. Cassette input/output unit 11B includes a drawer front 20B, a drawer bottom 22B, and a cassette 21B. Also shown in FIG. 3 is a robot 30 which is positioned pivotally inside photolithography unit 10. Robot 30 includes a robot arm 31 and a double end effector 32, which is capable of simultaneously holding two semiconductor wafers. Robot 30 may be a three-degree-of-freedom robot manufactured by Equipe Technologies of Mountain View, Calif.

As indicated, robot 30 is pivotable about a single vertical axis in unit 10. Thus, for robot arm 31 to gain access to wafers in both of cassettes 21A and 21B, it is necessary to pivot the cassettes about a vertical axis, as indicated by the position of cassette 21B in FIG. 3. To accomplish this, rotation plates 33A and 33B are provided. Rotation plates 33A and 33B are positioned adjacent drawer bottoms 22A and 22B, respectively, and pivot about vertical axes by means of a mechanism which is described below.

Figure 4A:
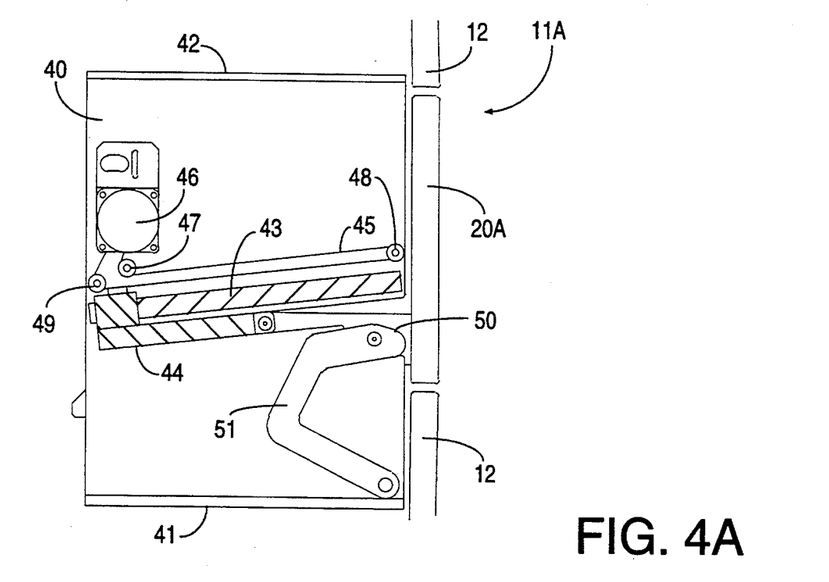
FIGS. 4A and 4B illustrate the mechanism for opening the cassette input/output unit, with the unit shown in closed and open positions, respectively.
Figure 4B:
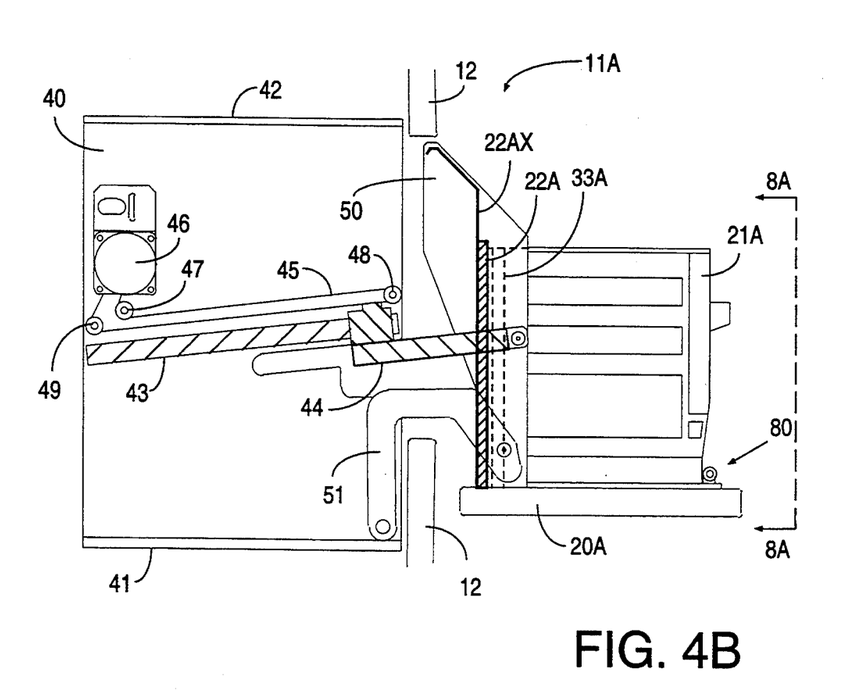

FIGS. 4A and 4B are side elevation views of cassette input/output unit 11A shown in the closed and open positions, respectively. The basic structure of unit 11A includes a left side plate 40, a base plate 41, and a top plate 42. These structures are fixed and do not move. Unit 11A is viewed from the left side (the direction indicated by arrows 4AB in FIG. 3), so that side plate 40 is visible. It will be understood that a similar right side plate forms the opposite wall of unit 11A. The operating structure connected to left side plate 40 is mirrored on the right side of unit 11A.

A slide rail 43 is attached to the surface of side plate 40. A slider 44 slides along slide rail 43. Attached to slider 44 is a drive belt 45, which is driven by a motor/encoder 46. Drive belt 45 is wrapped around pulleys 47, 48 and 49, and drives slider 44 along slide rail 43. An end of slider 44 is pivotally attached to a cassette I/O side 50, which is joined to drawer front 20A and drawer bottom 22A. As shown in FIG. 4B, drawer bottom 22A includes an extension 22AX which serves to prevent the operator from reaching into the interior of photolithography unit 11A.

Cassette I/O side 50 is also pivotally attached to a crank 51, the other end of which is pivotally attached to side plate 40. Thus, as is evident from FIGS. 4A and 4B, as motor/encoder 46 drives slider 44 from its rearward position (FIG. 4A) to its forward position (FIG. 4B), drawer front 20A rotates approximately 90° about a horizontal axis until it reaches the position shown in FIG. 4B. It is also apparent from FIGS. 4A and 4B that the unit which includes drawer front 20A, drawer bottom 22A and cassette I/O side 50 undergoes translational movement to the right when it is opened, although this is not critical to the invention.

Conversely, motor/encoder 46 closes unit 11A by driving slider 44 from its forward position to its rearward position on rail 43. Thus, as indicated in FIG. 4B, wafer cassette 21A is placed on drawer front 20A with the wafers oriented vertically inside wafer cassette 21A. Then, as unit 11A is closed, cassette 21A is rotated counterclockwise 90° until the wafers are oriented horizontally. Also, as indicated in FIG. 4B, when unit 11A is in its open position, drawer bottom 22A and extension 22AX prevent an operator (who would be stationed to the right) from gaining access through unit 11A to the interior of the equipment.

Figure 5A:
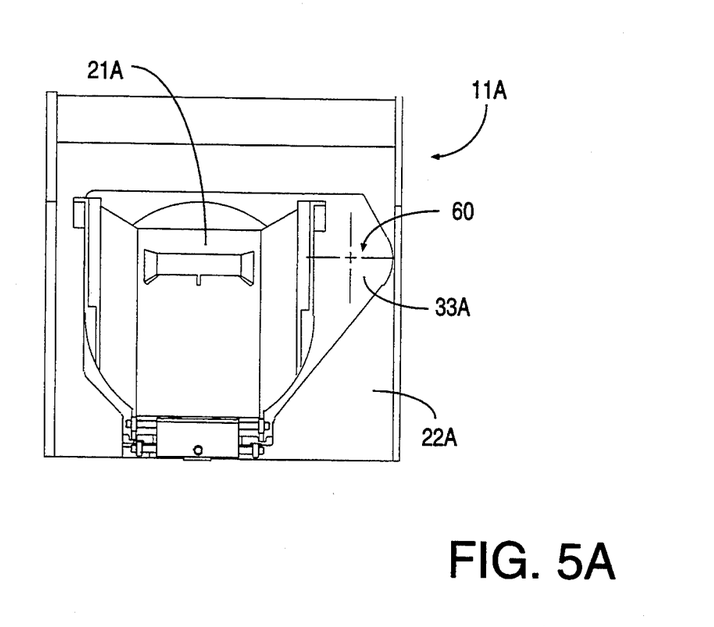
FIGS. 5A and 5B illustrate a top plan view of one of the cassette input/output units, with the rotation plate shown in retracted and rotated positions, respectively.
Figure 5B:
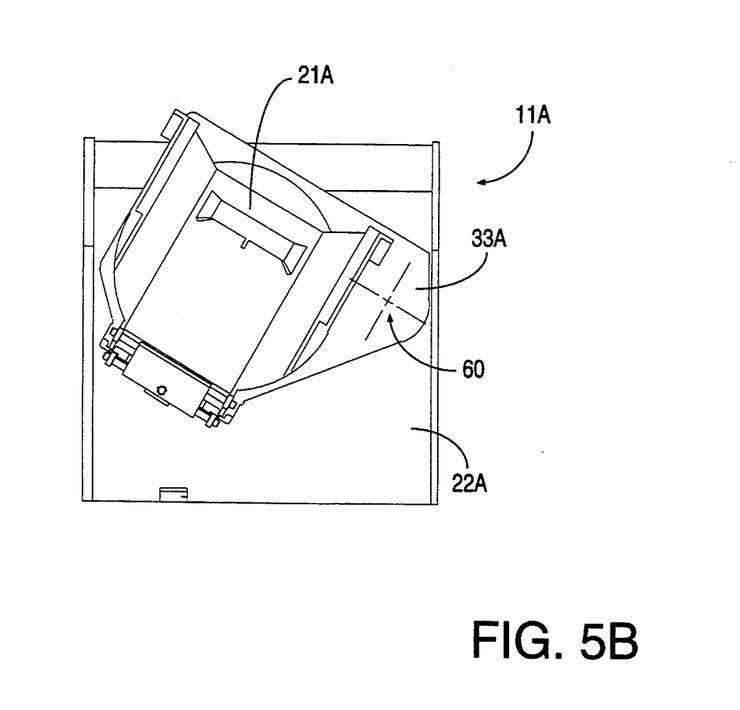

FIGS. 5A and 5B are detailed top views of rotation plate 33A. As shown, rotation plate 33A rotates clockwise about a pivot point 60 to bring wafer cassette 21A into a position (FIG. 5B) in which robot 30 may gain access to wafers held in cassette 21A. Of course, this feature of the invention may not be necessary if the robot inside photolithography unit 10 does not require the cassette to be rotated in order to gain access to the wafers.

Figure 6A:
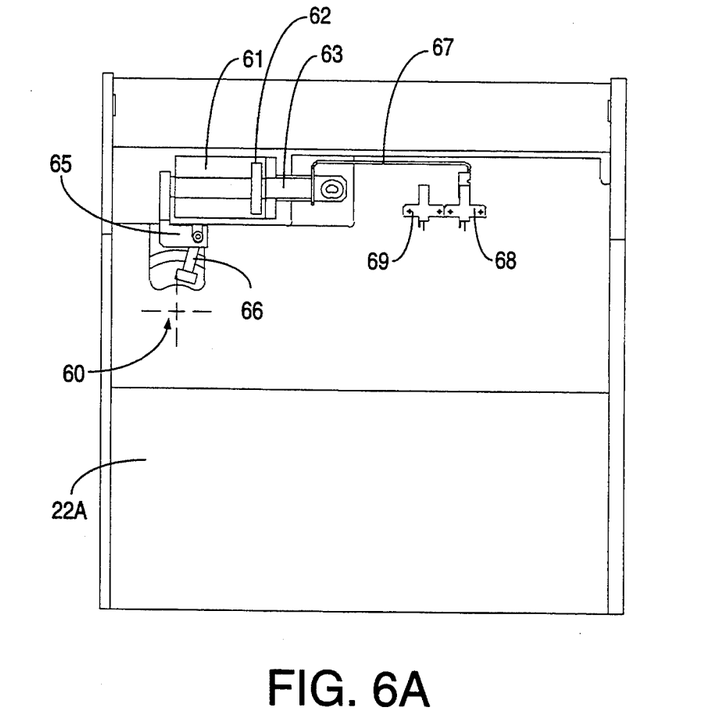
FIGS. 6A and 6B are bottom plan views of the cassette input/output unit with the rotation tray in retracted and rotated positions, respectively.
Figure 6B:
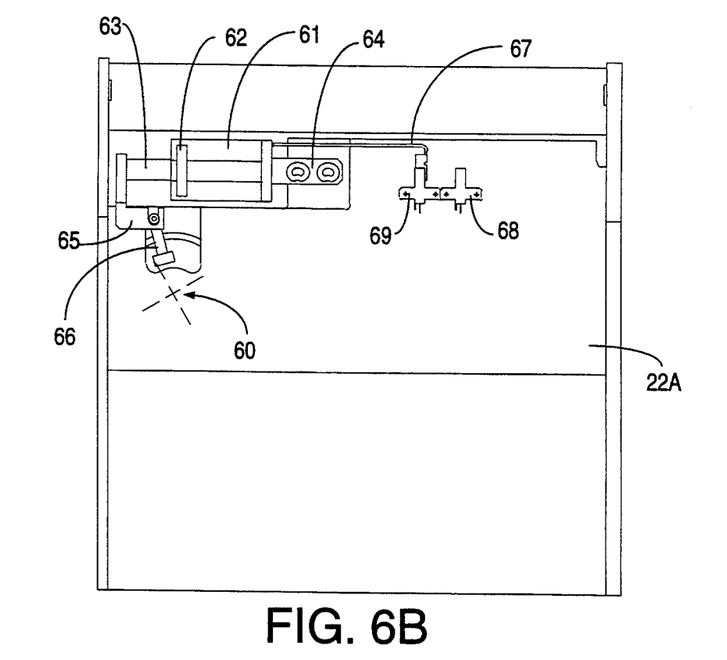

FIGS. 6A and 6B are views of the underside of drawer bottom 22A, showing the mechanism that is used to rotate rotation plate 33A. This mechanism includes an air cylinder 61, which is mounted to the bottom of drawer bottom 22A by means of a bracket 64. Extending through and from both ends of air cylinder 61 is a piston rod 63, which is attached to a piston 62 (dashed lines) inside air cylinder 61. Extending from rod 63 is an actuator 65 which engages a crank 66 attached to the bottom of rotation plate 33A.

The position of piston 62 is controlled by adding pressurized air to either side of air cylinder 61 through supply lines which are not shown. A position flag 67 extends from rod 63, the end of which actuates limit switches 68 and 69 to verify the position of rotation plate 33A for the microprocessor. Limit switch 68 operates when the rotation plate reaches the retracted position shown in FIG. 5A, and limit switch 69 is actuated when rotation plate 33A reaches the rotated position in FIG. 5B.

Figure 7A:
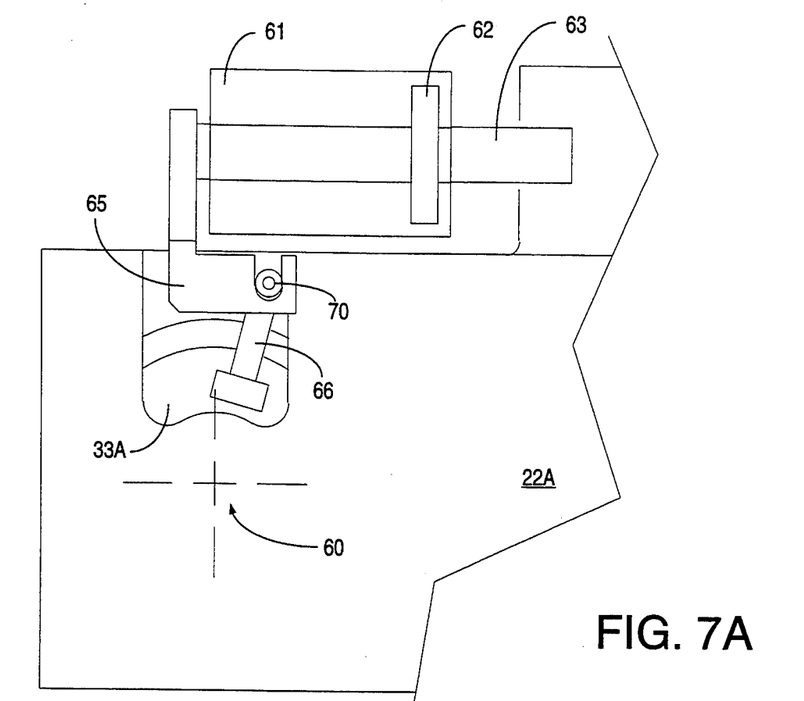
FIG. 7A illustrates a detailed view of the mechanism used to rotate the rotation plate corresponding to the retracted position for the rotation plate.
Figure 7B:
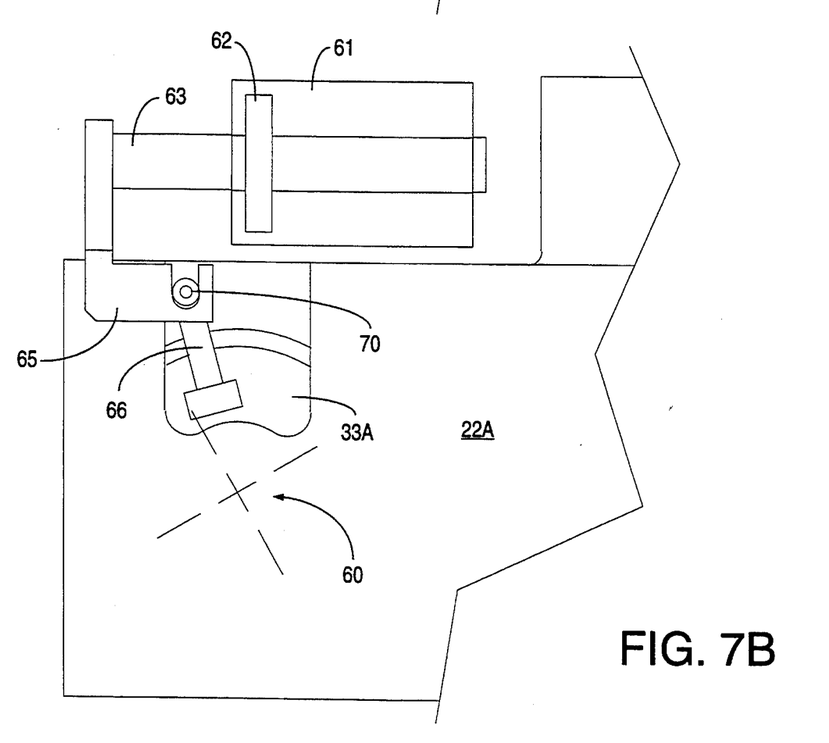
FIG 7B illustrates a detailed view of the mechanism used to rotate the rotation plate corresponding to the rotated position for the rotation plate.

Further details of this mechanism are illustrated in FIGS. 7A and 7B, which correspond to FIGS. 6A and 6B, respectively. Actuator 65 contains a slot which constrains a ball bearing 70 extending from crank 66. Thus, as piston rod 63 and actuator 65 translate from left to right, ball bearing 70 forms a mechanical linkage which causes rotation plate 33A to pivot about point 60. Ball bearing 70 prevents any sliding contact with the sides of the slot in actuator 65.

Figure 8A:
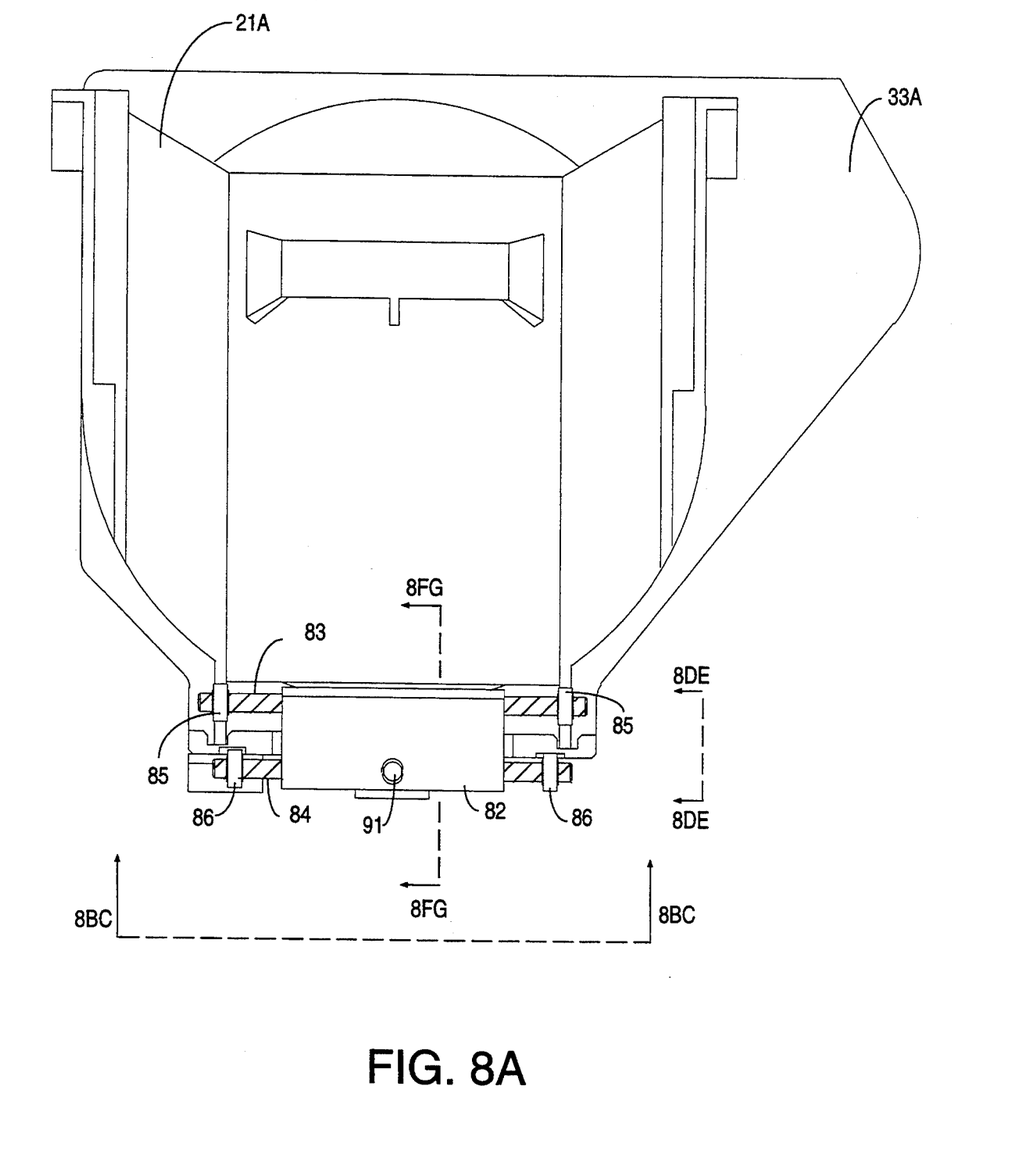
FIG. 8A illustrates a detailed view of the cassette clamp from the direction indicated by the arrows designated 8A in FIG. 4B.

FIG. 4B illustrates generally a clamp 80 which holds wafer cassette 21A in position after it is placed in the input/output unit. Clamp 80 is illustrated in greater detail in FIGS. 8A–8G. FIG. 8A illustrates clamp 80 from the direction indicated by the arrows 8A in FIG. 4B. In FIG. 8A, the wafers in wafer cassette 21A are oriented vertically. Clamp 80 includes a face plate 82, which is bored to receive shafts 83 and 84. Two pairs of rollers 85 and 86 are rotatably fitted on shafts 83 and 84, respectively.

Figure 8B:
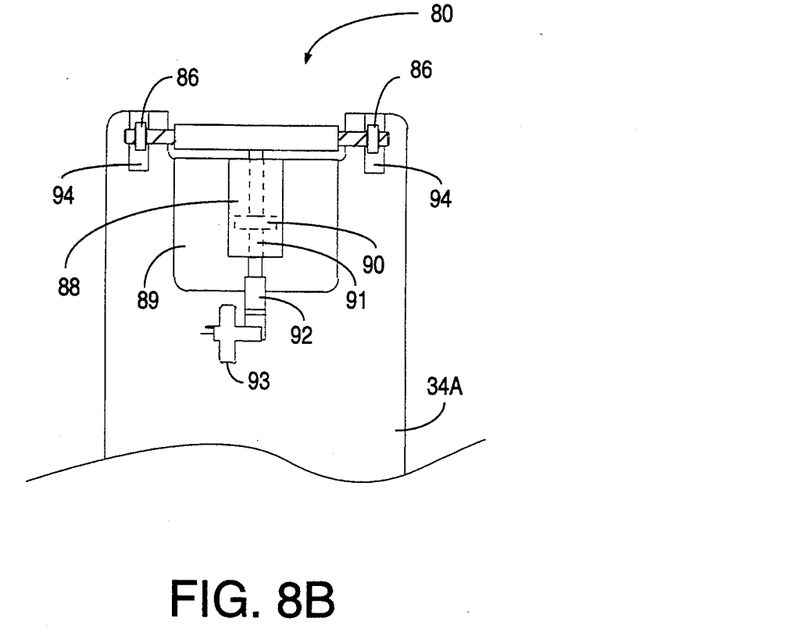
FIG. 8B illustrates a bottom plan view of the cassette clamp in the closed position, taken from the direction indicated by the arrows designated 8BC in FIG. 8A.
Figure 8C:
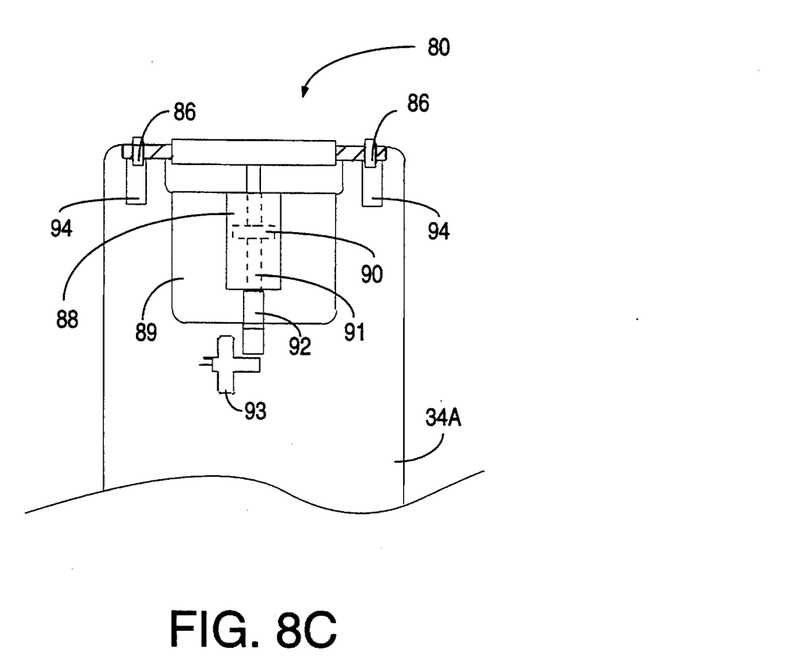
FIG. 8C illustrates a bottom plan view of the cassette clamp in the open position, taken from the direction indicated by the arrows designated 8BC in FIG. 8A.
Figure 8D:
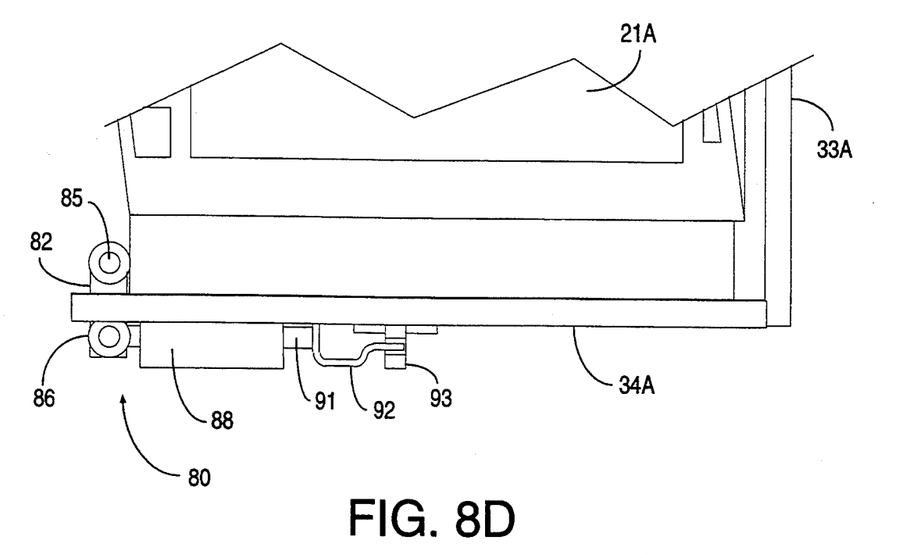
FIG. 8D illustrates a side elevational view of the cassette clamp in the closed position, taken from the direction indicated by the arrows designated 8DE in FIG. 8A.
Figure 8E:
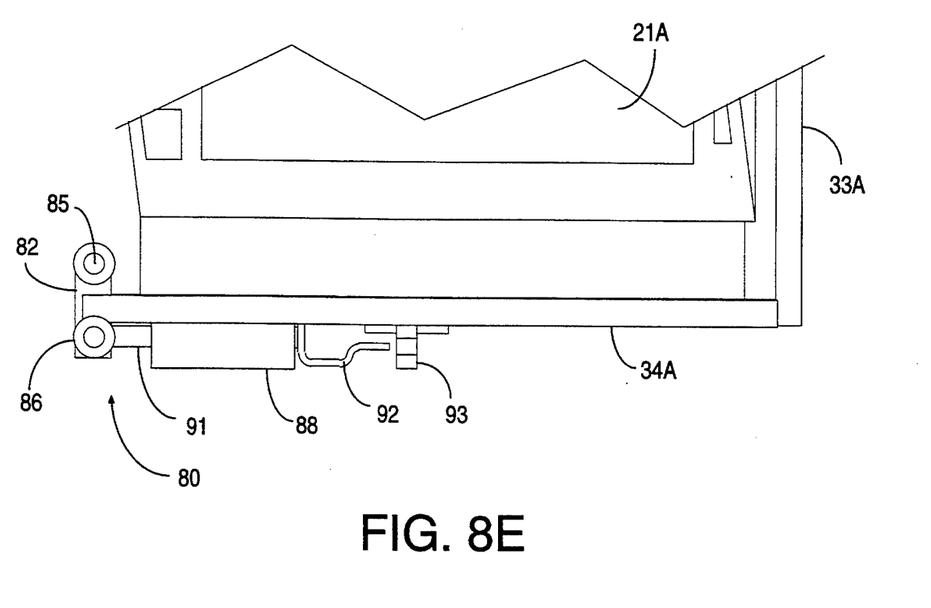
FIG. 8E illustrates a side elevational view of the cassette clamp in the open position, taken from the direction indicated by the arrows designated 8DE in FIG. 8A.
Figure 8F:
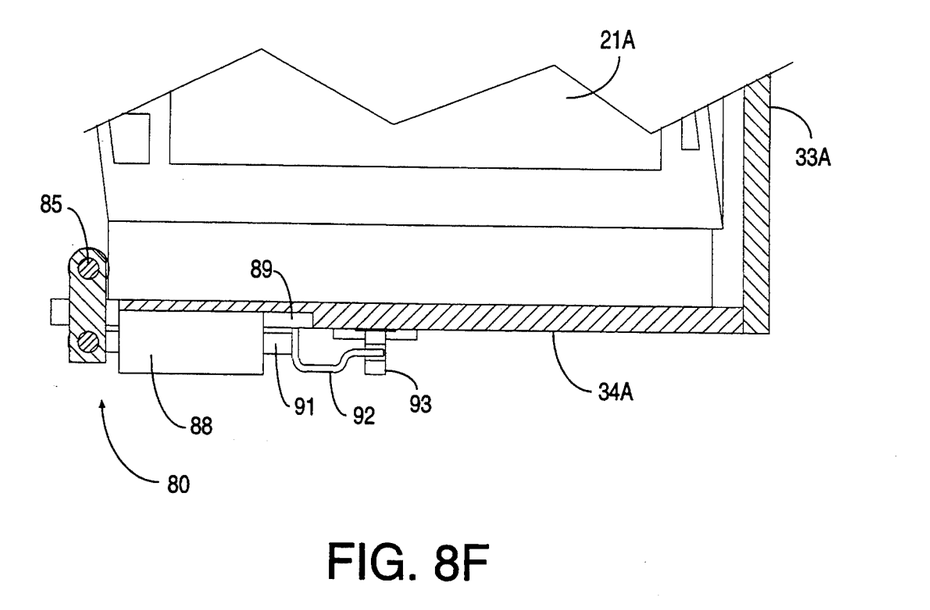
FIG. 8F illustrates a cross-sectional view of the cassette clamp in the closed position, taken at section 8FG—FG as shown in FIG. 8A.
Figure 8G:
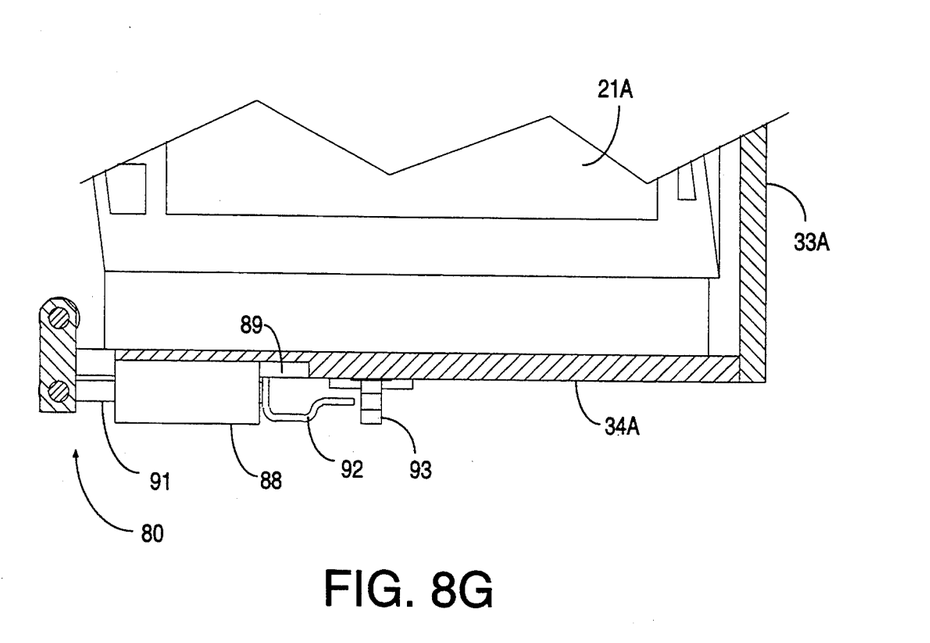
FIG. 8G illustrates a cross-sectional view of the cassette clamp in the open position, taken at section 8FG—8FG as shown in FIG. 8A.

Further details of clamp 80 are apparent from FIGS. 8B–8G. FIGS. 8B and 8C are bottom plan views taken from the direction indicated by arrows 8BC in FIG. 8A. FIGS. 8D and 8E are side elevational views taken from the direction indicated by the arrows 8DE in FIG. 8A. FIGS. 8F and 8G are cross-sectional views taken at section 8FG—8FG as shown in FIG. 8A. Attached at right angles to rotation plate 33A is a plate 34A, on which clamp 80 is mounted. plate 34A is essentially parallel to drawer front 20A and is therefore in a horizontal position when cassette input/output unit 11A is open. A spring return air cylinder 88 is mounted in a recess 89 on one side of plate 34A. Recess 89 is formed in the bottom side of plate 33B (when the unit is in the open position), and is visible in plan in FIGS. 8B and 8C and in cross section in FIGS. 8F and 8G. Spring return air cylinder 88 contains a piston 90 and a piston rod 91 which protrudes from both ends of air cylinder 88. Piston 90 is normally biased to the position shown in FIG. 8B by a spring internal to air cylinder 88; when pressurized air is introduced to air cylinder 88, the piston is forced to the position shown in FIG. 8C. One end of piston rod 91 is fitted firmly into a hole that is bored in face plate 82. The other end of piston rod 91 is attached to a flag 92, which activates a limit switch 93. As shown in FIGS. 8B and 8C, rollers 86 ride in slots 94 which are formed in plate 34A. This prevents piston rod 91 from rotating and thereby maintains face plate 82 in the proper position.

When cassette input/output unit 11A is open, air pressure is applied to air cylinder 88 through an air line (not shown) and clamp 80 is in the open position which is shown in FIGS. 8C, 8E and 8G. After cassette 21A has been placed in the cassette input/output unit, the pressurized air is released and the internal spring drives piston rod 91 to the right (from the perspective of FIGS. 8D–8G). As shown in FIGS. 8D and 8F, rollers 85 come into contact with cassette 21A, pressing it against rotation plate 33A. At the same time, flag 92 projects into limit switch 93, indicating to the microprocessor that clamp 80 has been closed. The use of rollers 85 ensures that there is no sliding friction with cassette 21A, which might generate particles.

When this process has been completed, cassette 21A is firmly clamped in place and unit 11A may be closed. When unit 11A is opened, air pressure is applied to spring return air cylinder 88, opening clamp 80 and allowing the cassette to be removed by the operator.

The cassette input/output units of this invention can be controlled in a variety of ways. As noted above, preferably the opening and closing of the unit is controlled by a microprocessor. In a relatively straight forward embodiment, the operator depresses a button to open or close the unit. In the preferred embodiment, a computer displays symbols or icons representing the various components in the semiconductor processing system. One of the components so displayed is the cassette input/output unit. By clicking on the symbol for the cassette input/output unit, the operator displays virtual buttons which may be depressed to open or close the unit. When an open or close instruction is given, the computer communicates with a microcontroller which controls the components of the cassette input/output unit.

When an instruction is given to open the unit, initially air cylinder 61 is actuated so as to move rotation plate 33A to its retracted position. Then motor/encoder 46 is driven to rotate drawer front 20A to the open position. Finally, clamp 80 is actuated to release the cassette. When the instruction to close the unit is given, the same sequence of operations is performed in reverse order.

The cassette input/output unit of this invention is capable of receiving a wafer cassette in the angular orientation it has when normally carried by the operator. Thus, the wrist action required to rotate the cassette with normal input/output units is avoided. The cassette is clamped securely in place as soon as it is placed in the unit. The unit then rotates the cassette to a position in which a robot arm can retrieve wafers from the cassette. If necessary, the cassette can be rotated about a vertical axis to position it properly in relation to the robot. Whether the unit is open or closed, the operator is unable to extend his or her arms into the interior of the photolithography unit.

While a single embodiment according to this invention has been described, it will be apparent that numerous alternative embodiments may be constructed according to the broad principles of this invention. The broad principles of this invention are to be construed as covering all such alternative embodiments. For example, the principles of this invention are applicable to any type of semiconductor processing equipment.

We claim:

1. A semiconductor processing system including a cassette input/output unit for introducing wafers or other substrates to said semiconductor processing system, said input/output unit comprising:
   a drawer front;
   a motor;
   a drive mechanism coupled to said motor and said drawer front for moving said drawer front between an open and a closed position, said drawer front being oriented substantially vertically when in said closed position and substantially horizontally when in said open position and rotating approximately 90° degrees about a horizontal axis as said drawer front is moved from said closed position to said open position; and
   a drawer bottom rigidly connected to and oriented at a right angle to said drawer front;
   a clamp positioned within said input/output unit for holding a cassette containing semiconductor wafers or other substrates inside said cassette input-/output unit as said drawer front rotates between said open and closed positions and while said drawer front is in said closed position; and a mechanism positioned within said semiconductor processing unit for transferring said wafers or other substrates from said input/output unit.

2. The semiconducting processing system of claim 1 wherein said clamp comprises a roller.

3. The semiconductor processing system of claim 1 comprising a rotation plate adjacent said drawer bottom, said rotation plate pivotable about an axis perpendicular to said drawer bottom.

4. The semiconductor processing system of claim 1 wherein said motor comprises a motor/encoder.

5. The semiconductor processing system of claim 1 wherein said drawer front prevents access to an interior of the semiconductor processing system when said drawer front is in said closed position and said drawer bottom prevents access to the interior of the semiconductor processing system when said drawer front is in said open position.

6. The semiconductor processing system of claim 1 further comprising a flag which indicates that said clamp is closed.

7. The semiconductor processing system of claim 3 further comprising a mechanism for rotating said rotation plate, said mechanism comprising a ball bearing.

8. The semiconductor processing system of claim 1 further comprising a cabinet enclosing said cassette input/output unit, said cabinet comprising a vertical wall, said vertical wall having an opening suitable to accommodate said drawer front when in said closed position, said drawer front preventing access to an interior of said cabinet and said opening being suitable to accommodate said drawer bottom when said drawer front is in said open position, said drawer bottom preventing access to an interior of said cabinet when said drawer front is in said open position.

9. The semiconductor processing system of claim 1 wherein said drive mechanism comprises:

a slider, one end of said slider being pivotally attached to a side of said cassette input/output unit, said cassette input/output unit side being joined to said drawer front; and a slide rail, said slider being mounted to slide along said slide rail, said slider being driven by said motor.

* * * * *